(12) United States Patent
Chang et al.

(10) Patent No.: US 7,728,673 B2
(45) Date of Patent: Jun. 1, 2010

(54) WIDEBAND ACTIVE BALUN USING DARLINGTON PAIR

(75) Inventors: Hong-Yeh Chang, Taoyuan County (TW); Shou-Hsien Weng, Taoyuan County (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 12/144,794

(22) Filed: Jun. 24, 2008

(65) Prior Publication Data

US 2009/0212872 A1    Aug. 27, 2009

(30) Foreign Application Priority Data

Feb. 21, 2008    (TW) .............................. 97106052 A

(51) Int. Cl.
    *H03F 3/45*    (2006.01)

(52) U.S. Cl. ..................................... 330/301
(58) Field of Classification Search ................. 330/301, 330/252–261, 283, 310; 333/25–26
See application file for complete search history.

(56) References Cited

U.S. PATENT DOCUMENTS

| 4,024,462 | A   | * | 5/1977  | Highnote et al. ............ 330/259 |
| 6,922,108 | B2  | * | 7/2005  | Lin ............................ 330/301 |
| 7,123,091 | B2  | * | 10/2006 | Sirito-Olivier et al. ...... 330/252 |

* cited by examiner

*Primary Examiner*—Robert Pascal
*Assistant Examiner*—Hieu P Nguyen
(74) *Attorney, Agent, or Firm*—Jackson IPG PLLC

(57) ABSTRACT

An active balun with Darlington pairs obtains a wideband operation. With differential output signals, a size of the active balun is minimized. The present invention can be applied to a transceiver. With a wideband amplitude match and 180° out of phase, the performance of the transceiver is improved by the present invention for a few wide applications.

5 Claims, 6 Drawing Sheets

WIDEBAND ACTIVE BALUN USING DARLINGTON PAIR

FIELD OF THE INVENTION

The present invention relates to an active balun; more particularly, relates to using Darlington pairs to form the active balun with a differential pair for an integrated circuit design, a radio-frequency or a microwave wireless network communication system.

DESCRIPTION OF THE RELATED ARTS

A balun is used to connect a balanced circuit and an unbalanced circuit. The balun is a critical circuit in a wireless communication system. In conventional technologies, a transformer is used as the balun; but there are magnetic loss and eddy current loss in coils and so the balun is limited to be used at high frequency. Hence, various types of balun are addressed, including a passive balun and an active balun. The passive balun has an insertion loss between 3 to 5 dB; and has a large size waste from a half wavelength required at low frequency and so the size is not reduced. On the other hand, the active balun avoids signal loss and obtains more than 0 dB signal gain. A design size is thus reduced and cost is saved. Some active balun are proposed. A field effect transistor (FET) can be used in a balun at a low frequency. A common source/gate is used in a narrow band application owing to a parasitic effect. A differential pair circuit is used, which is most often used in high band applications In general communication systems, for fulfilling requirements on data transferring amount and speed, a receiver at a radio-frequency end has to provide a good transferring quality. The active balun is a critical component in such a receiver. In the receiver, the active balun is used to connect a balanced circuit and an unbalanced circuit. For example, in a single-balanced mixer, signals from a local oscillator source are converted by the active balun into differential signals for an amplitude match; and the single-balanced mixer thus has a wideband operation and a small size. Hence, performance of the active balun affects performance of the circuit and further affects performance of the whole transceiver.

An ideal active balun aims to obtain a 0 dB gain difference with 180° out of phase. However, the above targets are hard to be achieved through the above prior arts. The performance of the transceiver is thus lowered. Hence, the prior arts do not fulfill all users' requests on actual use.

SUMMARY OF THE INVENTION

The main purpose of the present invention is to use Darlington pairs having a wideband small signal gain to practice an active balun having a differential pair and thus to obtain differential output signals having wideband with good amplitude and phase imbalances.

The second purpose of the present invention is to obtain an ideal active balun having a 0 dB small signal gain difference with 180° out of phase, where a design size and a cost are saved with no extra gain loss by solving a big waste in size from a half wavelength required for a passive balun operated at a low frequency.

The third purpose of the present invention is to be applied to circuits in a wideband system and furthermore to a transceiver module made of a low-cost silicon-based technology, where, with a wideband amplitude match and the 180° phase difference, a performance of the circuit is improved and a performance of the whole transceiver system is thus also enhanced for a wide application.

The fourth purpose of the present invention is to apply the present invention to other systems having various frequency specifications, such as a Bluetooth circuit, a microwave circuit, a millimeter wave circuit, a wireless local network and an ultra wideband wireless communication system.

To achieve the above purposes, the present invention is a wideband active balun using Darlington pairs, comprising a pair of Darlington pair modules and a current mirror, where the Darlington pair modules comprises a first Darlington pair module and a second Darlington pair module; the first Darlington pair module has an input matching circuit as an input, comprised of a first capacitor; the first and the second Darlington pair modules separately control base biases of first transistors and second transistors through bias resistors and first resistors, separately compensate the loss caused by the transistor model through the second inductor, separately stabilize the Darlington pair module through negative feedback resistors, separately have output matching circuits, and separately connect the output matching circuits to a first output and a second output; the output matching circuit comprises a third capacitor and an inductor with a resistor; the first Darlington pair module compensates a phase mismatch of the first output through a fourth capacitor; the fourth capacitor is a negative feedback capacitor serially connected between the third capacitor and the inductor; the second Darlington pair module compensates a phase mismatch of the second output through a second capacitor and the fourth capacitor; the first and the second Darlington pair modules separately connect inductor with a resistor serially; the inductor with a resistor separately connect to bypass capacitors and first voltages; the first voltage provides a working voltage; the current mirror makes the first and the second Darlington pair modules normally operated in an active region; the current mirror comprises a second resistor, two transistors and a second voltage; the second resistance controls a collector bias of a fourth transistor; the second voltage provides a working voltage; the current mirror provides a constant current source as a bias of a bipolar transistor; a ratio of an emitter current of the first transistor to an emitter current of the second transistor is equal to a ratio of a size of the first transistor to a size of the second transistor for obtaining a wide bandwidth; a whole stability is enhanced through the negative feedback resistor to improve an input return loss for obtaining a better stability for the circuit; and a ratio of a third current to a fourth current, flown to the third and the fourth transistors respectively, is properly adjusted through selecting a size of the third transistor and a size of the fourth transistor. Accordingly, a novel wideband active balun using Darlington pairs is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
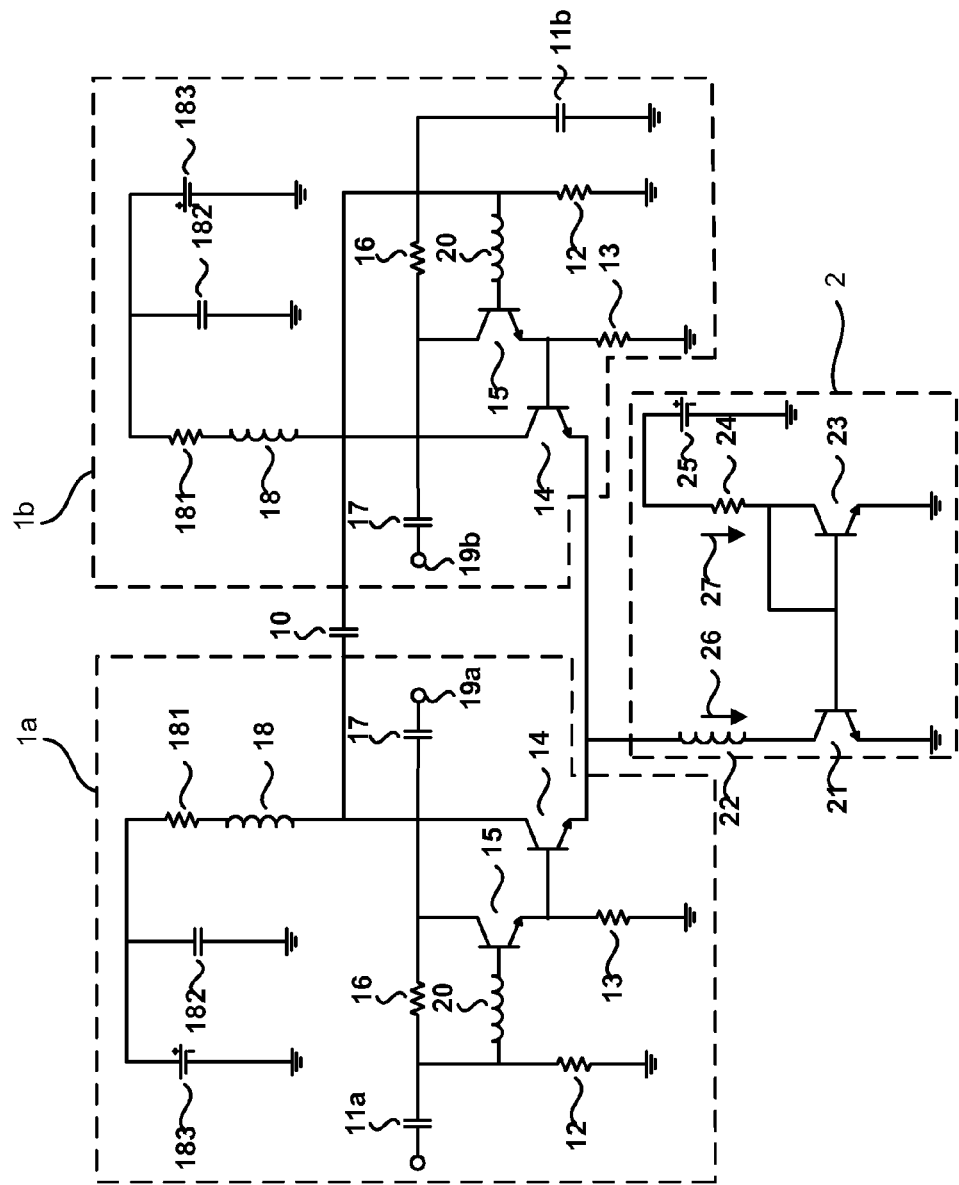
FIG. 1 is the structural view showing the preferred embodiment according to the present invention.

Please refer to FIG. 1, which is a structural view showing a preferred embodiment according to the present invention. As shown in the figure, the present invention is a wideband active balun using Darlington pairs, comprising a first Darlington pair module 1a, a second Darlington pair module 1b and a current mirror 2, where Darlington pairs are used to form an active balun; a design area for a low band application is saved to further save cost; and a performance of a circuit is enhanced with a wideband amplitude match and a 180° phase difference and thus a whole performance of a transceiver system is further enhanced as well.

The first and the second Darlington pair modules 1a,1b amplify input signals for obtaining wideband output signals. The first Darlington pair module 1a has an input matching circuit as an input, comprised of a first capacitor 11a. The first and the second Darlington pair modules 1a,1b separately control base biases of first transistors 14 and second transistors 15 through bias resistors 12 and first resistors 13; separately compensate the loss caused by the transistor model through the second inductor 20; separately stabilize the Darlington pair modules through negative feedback resistors 16; separately have output matching circuits, where the output matching circuit comprises a third capacitor 17 and an inductor 18 with a resistor 181; and separately connect the output matching circuits to a first output 19a and a second output 19b. The first Darlington pair module 1a compensates a phase mismatch of the first output 19a through a fourth capacitor 10, where the fourth capacitor 10 is a negative feedback capacitor serially connected between the third capacitor 17 and the inductor 18. The second Darlington pair module 1b compensates a phase mismatch of the second output 19b through a second capacitor 11b and the fourth capacitor 10. The first and the second Darlington pair modules 1a,1b separately connect inductor 18 with a resistor 181 serially; and the resistors 181 separately connect to bypass capacitors 182 and first voltages 183, where the first voltage 183 provides a working voltage.

The current mirror 2 makes the first and the second Darlington pair modules 1a, 1b normally operated in an active region. The current mirror 2 comprises a second resistor 24 and a second voltage 25, where the second resistor 24 controls a collector bias of a third transistor 23; and the second voltage 25 provides a working voltage.

Therein, a circuit of the active balun according to the present invention comprises active components and/or passive components such as a complementary metal-oxide semiconductor (CMOS), a SiGe transistor, a GaAs transistor, a heterojunction bipolar transistor (HBT), a high electron mobility transistor (HEMT) and a field effect transistor (FET). Thus, a novel wideband active balun using Darlington pairs is obtained On using the present invention, the current mirror 2 is a constant current source provided as a bias of a bipolar transistor. The first capacitor 11a of the first Darlington pair module 1a is used as an input matching circuit to match the input to 50 ohms (Ω). The third capacitors 17 and the inductors 18 with resistors 181 of the first and the second Darlington pair modules 1a,1b form output matching circuits to match the first and the second outputs 19a,19b to 50Ω. Through controlling the first transistor 14 and the second transistor 15 through the first resistor 13 and the bias resistor 12 respectively, a ratio of an emitter current of the first transistor 14 to an emitter current of the second transistor 15 is equal to a ratio of a size of the first transistor 14 to a size of the second transistor 15. Thus, a wide bandwidth is obtained. Then, stability is enhanced through the negative feed back resistor 16 to improve an input match for obtaining a good input return loss for the circuit. And the ratio of a third current 26 to a fourth current 27, flown to the third and the fourth transistors 21,23 respectively, is adjusted properly through selecting a size of the third transistor 21 and a size of the fourth transistor 23.

Please refer to FIG. 2 to FIG. 6, which are views showing the band curves of the small signal gains of the Darlington pair with and without the base series inductor Lb; band curves of input and output return losses; band curves of small signal gains; a band curve of the amplitude imbalance; and a band curve of the phase imbalance. As shown in the figures, the active balun according to the present invention has formulas for amplitude imbalance and phase imbalance:

Amplitude Imbalance=dB($S21$)−dB($S31$)    (1)

Phase Imbalance=phase($S21$)−phase($S31$)    (2)

Therein, dB (S21) is a small signal gain of the first output 19a to the input; dB (S31) is a small signal gain of the second output 19b to the input; phase (S21) is a phase delay of the first output 19a to the input; and phase (S31) is a phase delay of the second output 19b to the input. A current mirror and a pair of Darlington pair modules are used in the present invention to not only reduce a loss from input to output but also improve amplitude imbalance and phase imbalance by fine-tuning currents. Thus, a good return loss is obtained among an input return loss band curve 31 at input; an output return loss band curve 32 at the first output 19a; and an output return loss band curve 33 at the second output 19b.

Figure 2:
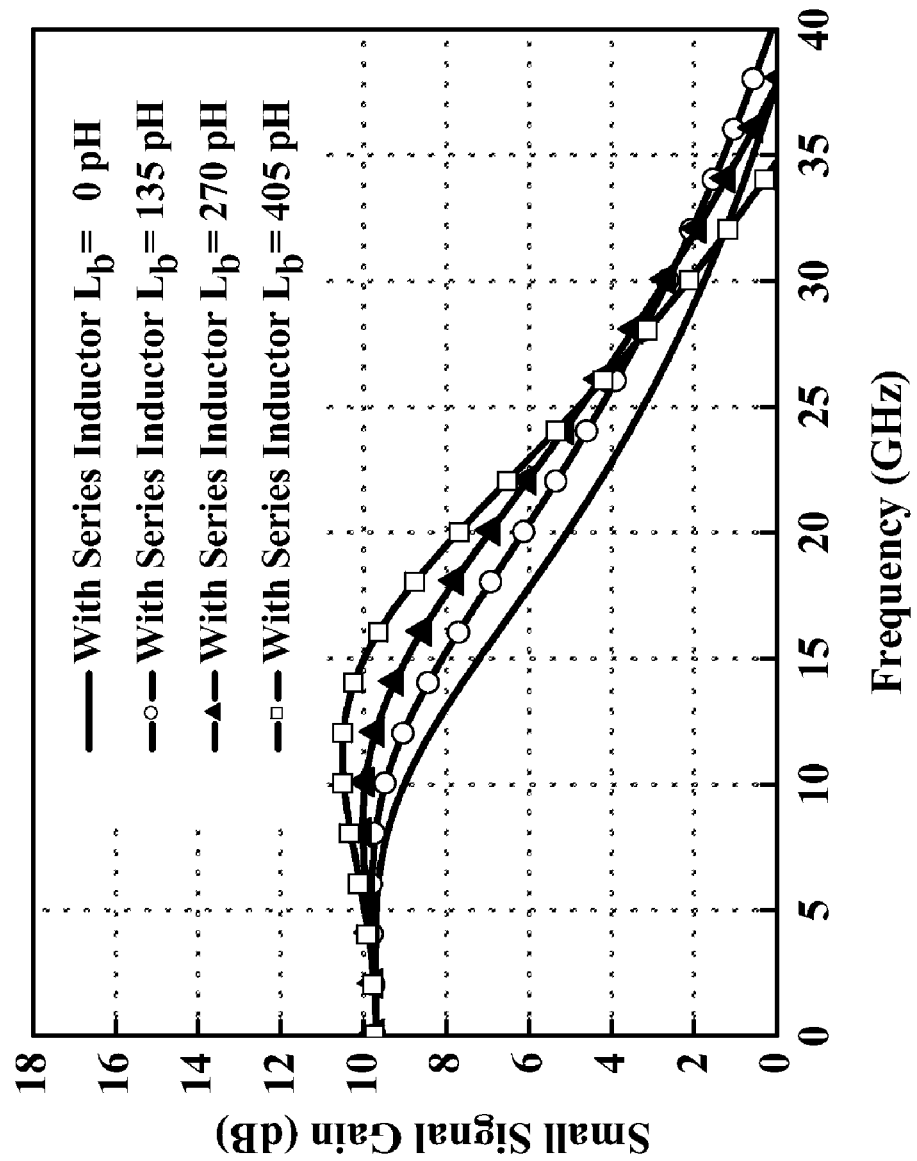
FIG. 2 is the view showing the band curves of the small signal gains of the Darlington pair with and without the base series inductor Lb.
Figure 3:
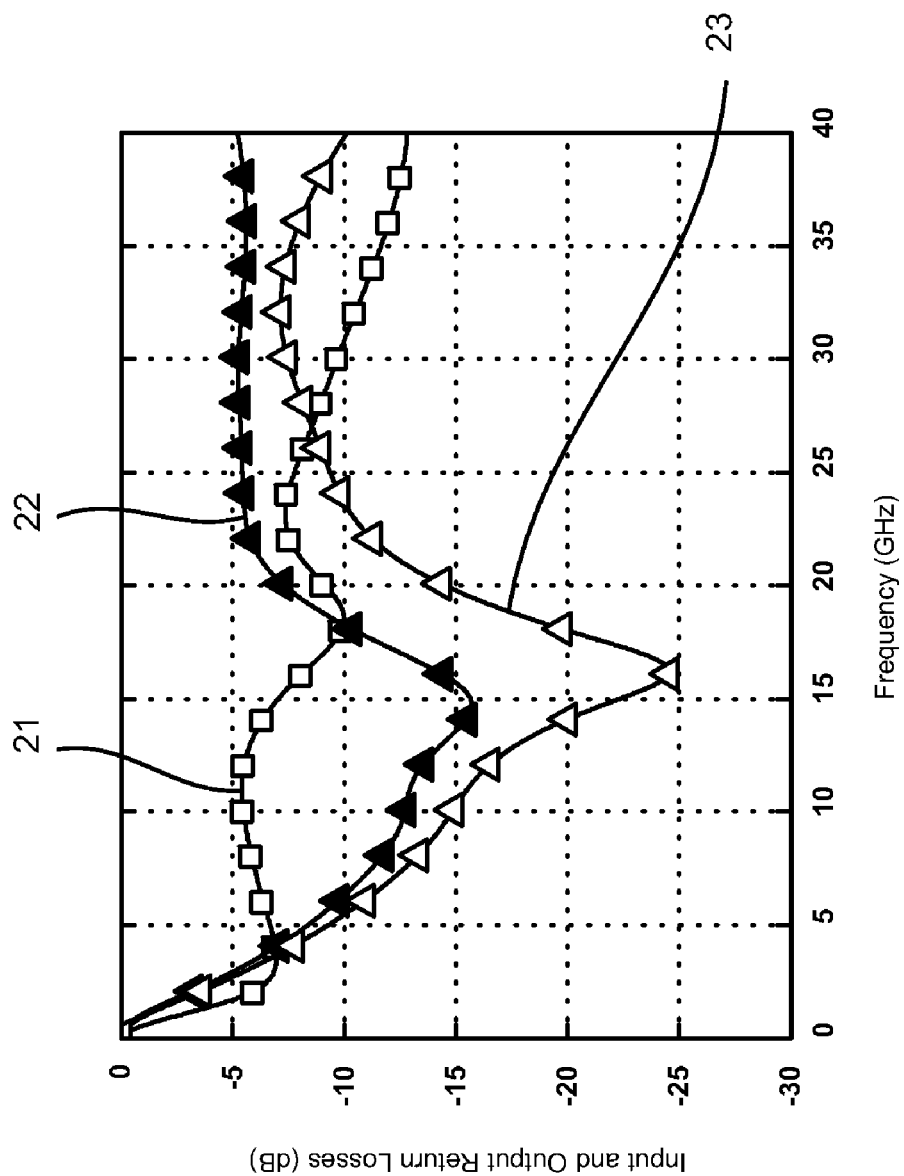
FIG. 3 is the view showing the band curves of the input and output return losses.
Figure 4:
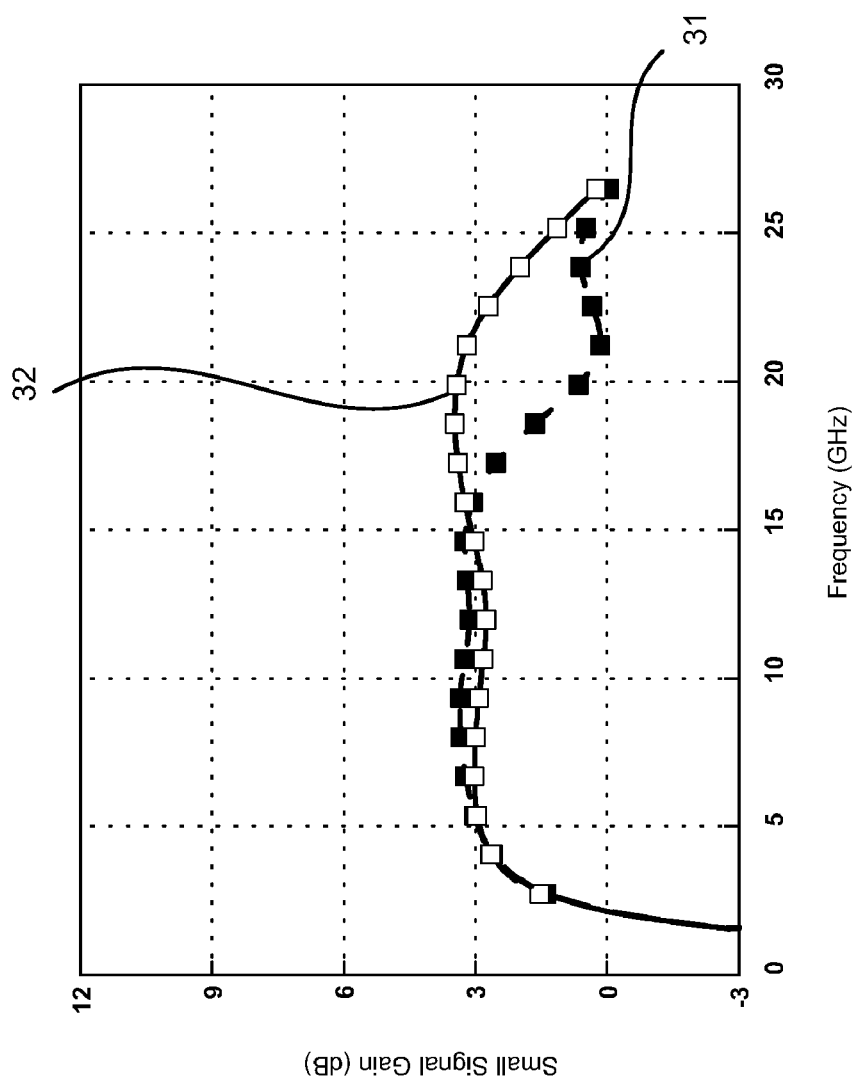
FIG. 4 is the view showing the band curves of the small signal gains.
Figure 5:
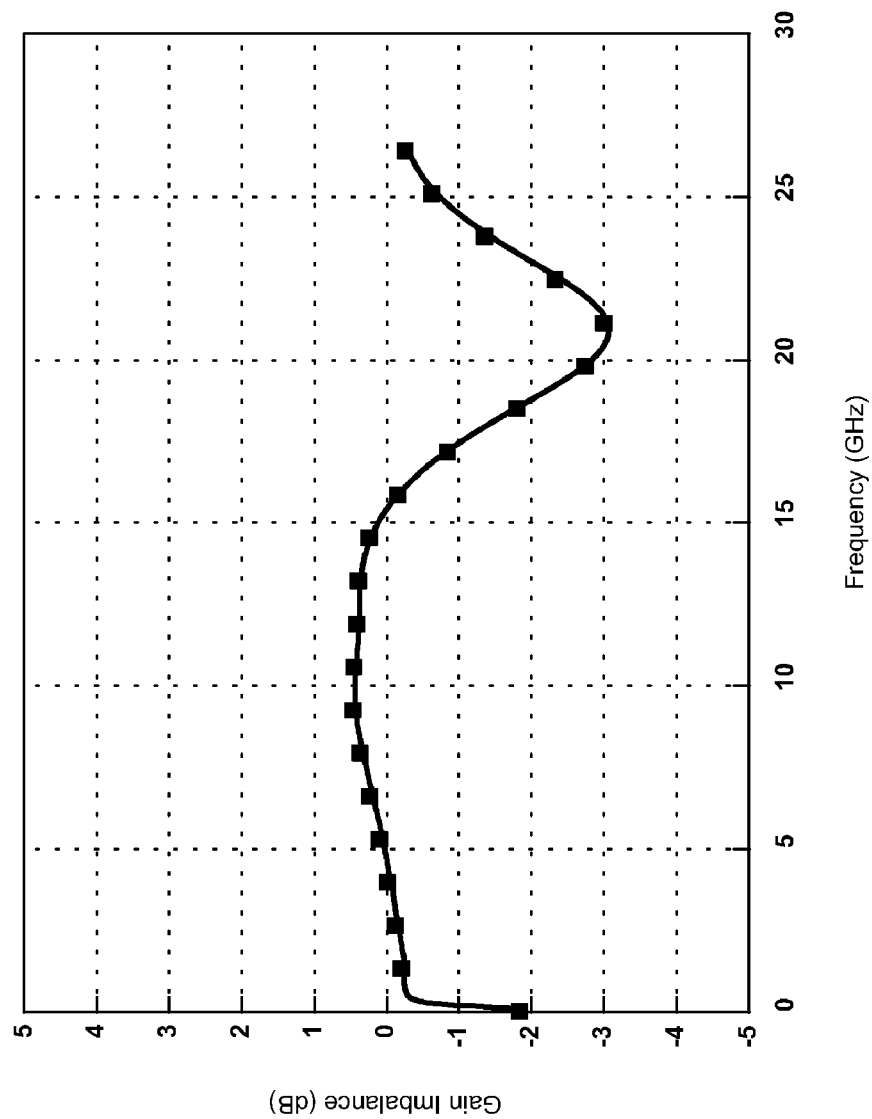
FIG. 5 is the view showing the band curve of the amplitude imbalance.
Figure 6:
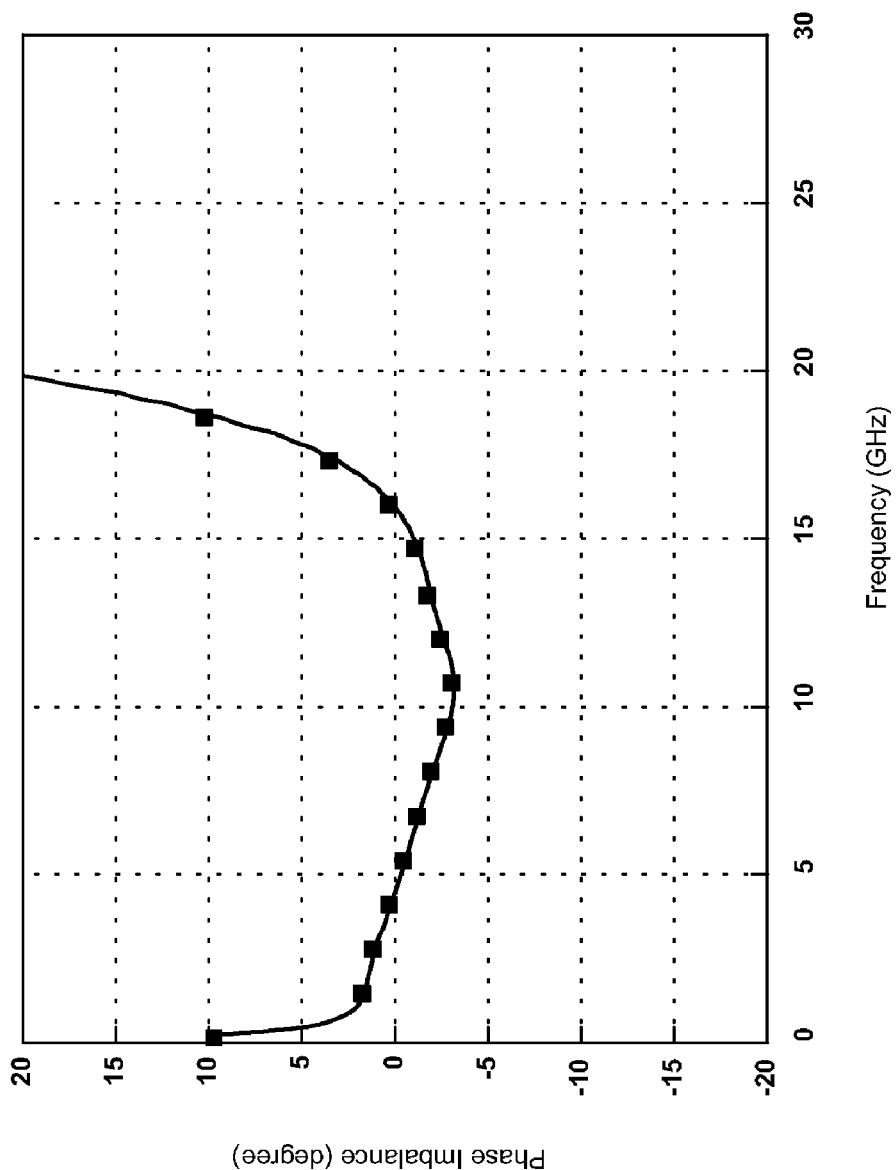
FIG. 6 is the view showing the band curve of the phase imbalance.

As shown in FIG. 2, the loss caused by transistor model can be compensated and the 3-dB bandwidth of the Darlington pair can be further extended as well as the bandwidth of the active balun. As shown in FIG. 3 and FIG. 4, the active balun according to the present invention has flat and wideband small signal gain band curves at the first and the second outputs 19a,19b. Not only a 0 dB gain imbalance is obtained for two outputs; but also 180° out of phase is obtained as well. As shown in FIG. 5 and FIG. 6, based on the flat and wideband small signal gain band curves, the present invention can be applied in a radio-frequency (RF) circuit of C-band, X-band or Ku-band with a 1 dB amplitude imbalance and a 10° phase imbalance. Accordingly, the present invention is characterized in small size, good performance and wideband application.

The present invention uses a Darlington pair with a wideband small signal gain to practice an active balun having a differential pair; and, thus, differential outputs having wideband performance and good amplitude balance with phase balance are obtained. The present invention can be applied to circuits in a wideband system, such as a balanced mixer, a frequency eliminator, a low-noise amplifier or a modulator. The present invention not only obtains a wideband operation but also a 0 dB gain difference with 180° out of phase for an ideal active balun with no extra loss to the system at the same time. Hence, a large waste in size from a half wave length required for a passive balun operated at a low frequency is solved for a minimized size and a good performance.

Besides, with the wideband operation, the present invention can be applied to other systems having various frequency specifications, such as a Bluetooth circuit, a microwave circuit, a millimeter wave circuit, a wireless local network and an ultra wideband wireless communication system. Furthermore, the present invention can be applied in a transceiver module, which is practiced with a low-cost silicon-based material. With the wideband amplitude match and the 180° out of phase, a performance of the circuit is improved and a performance of the whole transceiver system is thus also enhanced for a wide application.

To sum up, the present invention is a wideband active balun using Darlington pairs, where Darlington pairs are used with a wideband small signal gain to practice an active balun having a differential pair, and differential outputs having wideband performance and good amplitude imbalance with phase imbalance are thus obtained; a waste in size is solved for a minimized size and a low cost; and, with a wideband amplitude match with 180° out of phase, a performance of a circuit according to the present invention is improved and a performance of a whole transceiver system is thus also enhanced for a wide application.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A wideband active balun using Darlington pairs, comprising:

two Darlington pair modules, said Darlington pair modules comprising a first Darlington pair module 1a and a second Darlington pair module 1b, said first Darlington pair module having an input matching circuit, said input matching circuit comprising a first capacitor 11a, said first Darlington pair module and said second Darlington pair module having an second inductor 20 series with the second transistor 15, said first Darlington pair module and said second Darlington pair module separately controlling base biases of first transistors 14 and base biases of second transistors 15 through first resistors 13 and bias resistors 12 respectively, said first Darlington pair module and said second Darlington pair module being stabilized through negative feedback resistors 16 separately, said first Darlington pair module and said second Darlington pair module separately having output matching circuits, said output matching circuit comprising a third capacitor 17 and an inductor 18 with a resistor 181, said output matching circuits of said first Darlington pair module and said second Darlington pair module separately connecting to a first output 19a and a second output 19b, said first Darlington pair module and said second Darlington pair module separately having the inductor 18 serially connected with the resistor 181, a current mirror 2 comprising a second resistor 24, two transistors and a second voltage 25, said current mirror providing a constant current source to have said first Darlington pair module and said second Darlington pair module operated in an active region, said second resistor controlling a collector bias of a third transistor 23, said second voltage 25 providing a working voltage, wherein a phase imbalance of said first output 19a of said first Darlington pair module is compensated through a fourth capacitor 10;

wherein a phase imbalance of said second output of said second Darlington pair module is compensated through a second capacitor 11b and said fourth capacitor 10; and wherein said fourth capacitor is a positive feedback capacitor serially connected between said third capacitor 17 and said second capacitor 11b.

2. The balun according to claim 1,
wherein a circuit of said balun comprises components each selected from a group consisting of a complementary metal-oxide semiconductor (CMOS), a SiGe transistor, a GaAs transistor, a heterojunction bipolar transistor (HBT) and a field effect transistor (FET); and
wherein said component is selected from a group consisting of an active component and a passive component.

3. The balun according to claim 1,
wherein a ratio of an emitter current of said first transistor 14 to an emitter current of said second transistor 15 is equal to a ratio of a size of said first transistor 14 to a size of said second transistor 15.

4. The balun according to claim 1,
wherein said constant current source is a bias of a bipolar transistor.

5. The balun according to claim 1,
wherein said a second inductor 20 used to compensate the loss series with the second transistor 15.

* * * * *